United States Patent
Mitani

(10) Patent No.: US 6,622,196 B1
(45) Date of Patent: Sep. 16, 2003

(54) METHOD OF CONTROLLING SEMICONDUCTOR MEMORY DEVICE HAVING MEMORY AREAS WITH DIFFERENT CAPACITIES

(75) Inventor: Hidenori Mitani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 139 days.

(21) Appl. No.: 09/624,600

(22) Filed: Jul. 25, 2000

(30) Foreign Application Priority Data

Jan. 25, 2000 (JP) ...................... P2000-015734

(51) Int. Cl.⁷ .......................... G06F 12/00; G11C 16/00
(52) U.S. Cl. ........................................ 711/5; 711/103
(58) Field of Search ............................... 711/5, 100, 102, 711/103, 105, 111, 154, 200, 203; 365/185, 189.29

(56) References Cited

U.S. PATENT DOCUMENTS 5,621,738 A * 4/1997 Caywood et al. ........... 714/721
6,091,637 A * 7/2000 Hakozaki ............... 365/185.22
6,147,902 A * 11/2000 Rolandi ................. 365/185.03
6,353,553 B1 * 3/2002 Tamada et al. ......... 365/185.03

* cited by examiner

*Primary Examiner*—Tuan V. Thai
(74) *Attorney, Agent, or Firm*—McDermott, Will & Emery

(57) ABSTRACT

Two 256-Mbit memories constitute a first level (LV1) and four 64-Mbit memories constitute a second level (LV2). The two 256-Mbit memories are included in groups (0, 1), and the groups (0, 1) each have one 64-Mbit memory besides the 256-Mbit memory. On a matrix array of the 256-Mbit memory, a plurality of sectors each having 512 bytes are arrayed in one column. The remainder two 64-Mbit memories constitute groups (2, 3) by themselves, respectively, each of which has a configuration where a plurality of sectors each having 512 bytes are arrayed in one column. Thus, without complicating a constitution of a card-type memory device, a method of controlling a semiconductor memory device which allows AND-type flash memories having different capacities to be incorporated can be provided.

7 Claims, 7 Drawing Sheets

FIG. 3

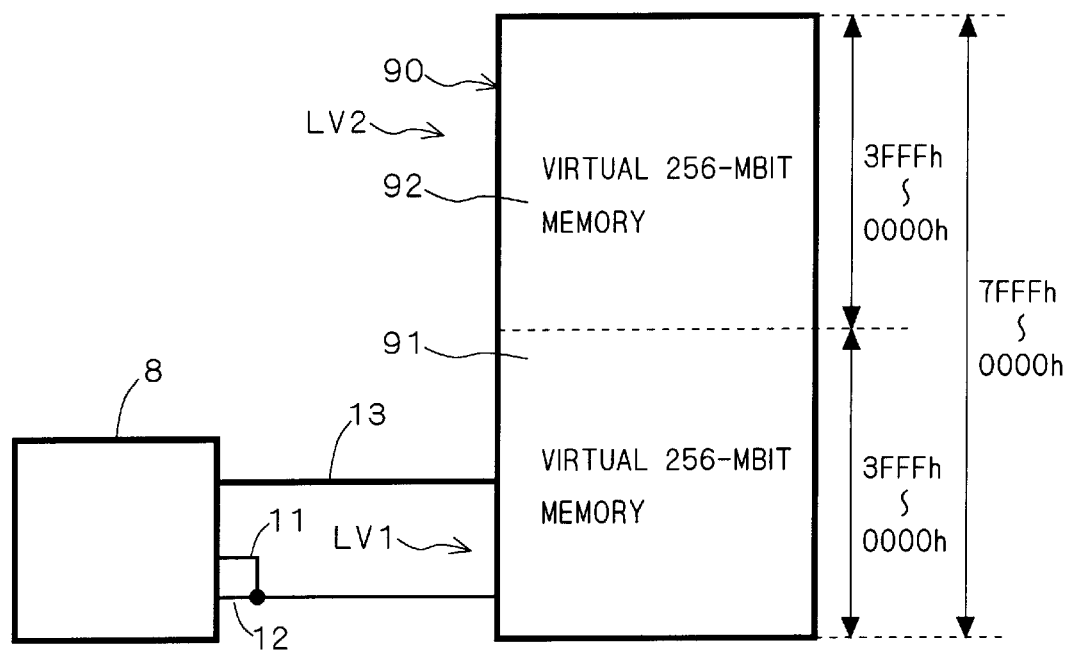
F I G. 7

FIG. 9

METHOD OF CONTROLLING SEMICONDUCTOR MEMORY DEVICE HAVING MEMORY AREAS WITH DIFFERENT CAPACITIES

BACKGROUND OF THE INVENTION

1. Field of the Invention

The present invention relates to a method of controlling a semiconductor memory device, and more particularly to a method of controlling a semiconductor memory device on which an AND-type flash memory is mounted.

2. Description of the Background Art

In recent years, a card-type memory device, such as a flash ATA (AT attachment) card and a compact flash card, has been proposed as an external memory device for a computer. This is composed of a large-capacity flash memory for data storage, a controller for controlling and managing the flash memory and a peripheral circuit. The controller performs both management of the interface between the memory device and a host system, such as a personal computer, and control and management of the flash memory according to instructions of the host system.

In recent, capacity of the flash memory has increased and a memory having a capacity of 32 megabits has begun to be used for one chip. Accordingly, it has become standard that a card capacity is determined in a multiple manner, as 32 megabits, 64 megabits and 128 megabits.

Therefore, to obtain a card having intermediate capacity, it is necessary to mount a plurality of flash memories smaller in capacity than 32 megabits, to mount a flash memory larger in capacity than 32 megabits and format the memory in smaller capacity, or to combine a plurality of types of flash memories having different capacities.

The case of combining a plurality of types of flash memories having different capacities is problematic. The size per flash sector (hereinafter, referred to as flash sector size) of an AND-type flash memory having 64 megabits (hereinafter, referred to as 64-Mbit memory) is 512 bytes and the flash sector size of an AND-type flash memory having 256 megabits (hereinafter, referred to as 256-Mbit memory) is 2048 bytes.

Accordingly, the capacities of the 64-Mbit memory and the 256-Mbit memory are calculated as follows:

"64-Mbit memory"
The flash sector size is; 512 bytes (data area)+16 bytes (control area)=528 bytes,
The capacity is; 528 bytes×16384 sectors×8=69206016 bits.
"256-Mbit memory"
The flash sector size is; 2048 bytes (data area)+64 bytes (control area)=2112 bytes,
The capacity is; 2112 bytes×16384 sectors×8=27682406 bits.

In the card-type memory device, operations of read, program (write) and erase are performed in units of 512 bytes. For this reason, in order to control the flash memories having different flash sector sizes, controllers in conformity with the respective specifications of the flash memories and firmwares for managing the sectors are needed, and merely combining a plurality of types of flash memories having different capacities makes the constitution of the card-type memory device more complicate.

SUMMARY OF THE INVENTION

The present invention is directed to a method of controlling a semiconductor memory device. According to a first aspect of the present invention, the method of controlling a semiconductor memory device controls operations of at least one first memory element and at least one second memory element which are different from each other, and in the method of the first aspect, a first access operation is performed on the at least one first memory element when a memory area to be externally accessed belongs to the at least one first memory element, and a second access operation is performed on the least one second memory element when the memory area to be externally accessed belongs to the at least one second memory element.

According to a second aspect of the present invention, in the method according to the first aspect, the at least one first memory element and the at least one second memory element each has a memory area consisting of a plurality of sectors, and the method comprises the steps of: (a) assigning logical sector numbers each not larger than a predetermined value to the plurality of sectors in the at least one first memory element and assigning logical sector numbers each larger than the predetermined value to the plurality of sectors in the at least one second memory element; and (b) designating the memory area to be externally accessed by the logical sector number and comparing a designated-sector number which is thus designated with the predetermined value.

According to a third aspect of the present invention, in the method according to the second aspect, the logical sector numbers assigned to the sectors in the at least one first memory element are arrayed in units of first predetermined number and the logical sector numbers assigned to the sectors of the at least one second element are arrayed in units of second predetermined number in the step (a), and the method further comprises the step of: (c) performing the first access operation and the second access operation in units of the first predetermined number and in units of the second predetermined number, respectively.

According to a fourth aspect of the present invention, in the method according to the third aspect, the at least one first memory element provides a plurality of first memory elements and the at least one second memory element provides a plurality of second memory elements, and a logical cluster number is assigned in common to the plurality of first memory elements in units of the first predetermined number and another logical cluster number is assigned in common to the plurality of second memory elements in units of the second predetermined number in the step (a).

According to a fifth aspect of the present invention, the method of controlling a semiconductor memory device controls operations of at least one first memory element having a first storage capacity and at least one second memory element having a second storage capacity twice as large as the first storage capacity, and in the method of the fifth aspect, the at least one second memory element is separately recognized as a first virtual memory element and a second virtual memory element each having the first memory capacity, and the same access operation as performed on the at least one first memory element is performed on each of the first and second virtual memory elements.

According to a sixth aspect of the present invention, in the method according to the fifth aspect, an extension signal indicating whether the first virtual memory element or the second virtual memory element a memory area to be externally accessed belongs to is generated together with a designated-address signal specifying the memory area to be externally accessed.

According to a seventh aspect of the present invention, in the method according to the sixth aspect, the at least one first memory element and the at least one second memory element each has a memory area consisting of a plurality of sectors, logical sector numbers are assigned to all the plurality of sectors, the logical sector numbers being different from one another, the logical sector numbers are arrayed in units of predetermined number in each of the at least one first memory element and the at least one second memory element, and the memory area to be externally accessed is accessed in units of the predetermined number.

According to an eighth aspect of the present invention, in the method according to the seventh aspect, the at least one first memory element and the at least one second memory element each has a predetermined number of input terminals for inputting the designated-address signal, and the extension signal is inputted to the at least one second memory element through a terminal among the input terminals of the at least one second memory element, the terminal corresponding to a redundant terminal among the input terminals of the at least one first memory element.

In the method of controlling a semiconductor memory device of the first aspect of the present invention, even when the first and second memory elements are mounted on one memory device, it is possible to control its operation with a single controller.

In the method of the second aspect of the present invention, by comparing the number of the designated sector which is represented by the logical sector number with the predetermined number, it is possible to easily judge whether the first memory element or the second memory element the memory area designated by the designated-sector number belongs to.

The method of the third aspect of the present invention, for example when the at least one first memory element and the at least one second memory element include a plurality of first memory elements and a plurality of second memory elements, respectively, allows both or either of a parallel operation where one of a plurality of first memory elements performs the first access operation while another prepares the first access operation and a parallel operation where one of a plurality of second memory elements performs the second access operation while another prepares the second access operation, thereby enhancing efficiency of the operation.

In the method of the fourth aspect of the present invention, different logical cluster numbers can be assigned to the first memory element and the second memory element and management of sector address thereby becomes easier.

In the method of the fifth aspect of the present invention, even if the first and second memory elements are mixed in a single memory device, since substantially the same control as performed in a case of providing a plurality of first memory elements can be performed and the memory device needs only one controller, it is possible to facilitate enlargement of the memory device.

In the method of the sixth aspect of the present invention, it is possible to extend the address of the memory element to be accessed on the basis of the extension signal, and as to the second memory element, the same access operation as performed on the first memory element can be performed on the first and second virtual memory elements.

The method of the seventh aspect of the present invention allows a parallel operation where the first memory element performs the first access operation while the first virtual memory element prepares the second access operation or a parallel operation where the first virtual memory element performs the first access operation while the first memory element prepares the second access operation, thereby enhancing efficiency of the operation.

In the method of the eighth aspect of the present invention, it is possible to make the number of the input terminals in the second memory element among the plurality of input terminals equal to the number of the input terminals in the first memory element, and therefore the flexibility of the second memory element is enhanced.

An object of the present invention is to provide a method of controlling a semiconductor memory device which allows AND-type flash memories having different capacities to be incorporated without complicating a constitution of a card-type memory device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 shows a sector array of a plurality of 256-Mbit AND-type flash memories;

FIG. 7 is a conceptional diagram showing a method of controlling an AND-type flash memory in accordance with a second preferred embodiment of the present invention;

FIG. 9 shows a sector array of the AND-type flash memory in accordance with the second preferred embodiment of the present invention.

DESCRIPTION OF THE PREFERRED EMBODIMENTS

Introduction

A flash memory has a specific problem of high defective ratio of elements, unlike other memory devices such as RAM (Random Access Memory). Therefore, actual addresses in the flash memory, i.e., physical addresses are discontinuous and a physical address to be used does not coincide with a logical address designated by a host system.

Figure 1:
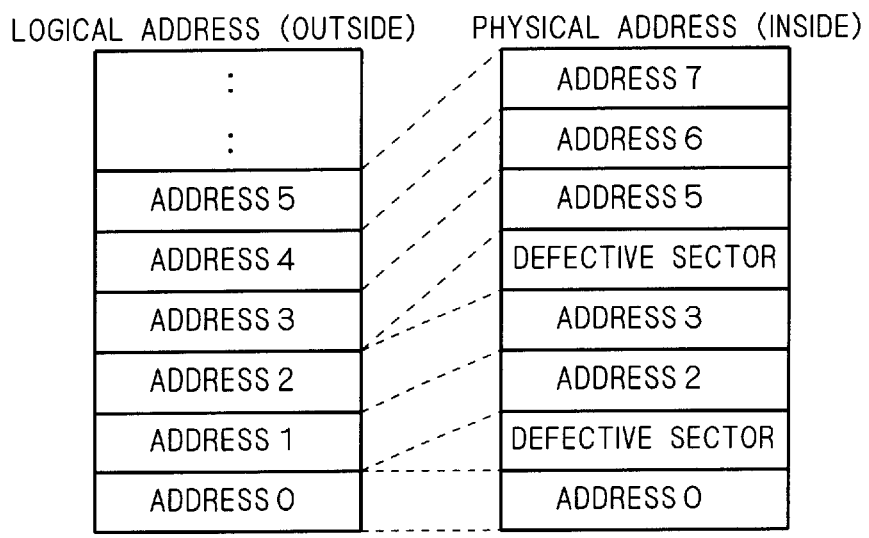
FIG. 1 shows correspondence between logical addresses and physical addresses.

FIG. 1 is a conceptional diagram for discussion on the specific problem of the flash memory, showing a correspondence between continuous logical addresses designated by the external host system and physical addresses in a flash memory. In FIG. 1, with respect to the continuous logical addresses 0 to 5, sectors associated with the physical addresses 1 and 4 are defective and can not be used in the flash memory, and therefore there is a mismatch in the correspondence between the logical address and the physical address.

Due to such a mismatch, the physical address in the flash memory can not be correctly accessed with the logical address given by the host system, and it thereby becomes necessary that a controller should make a table as shown in FIG. 1 for managing the sector information of the flash memory in a card and the logical address designated by the host system should be converted into an actual physical address by referring to the above table.

In consideration of this specific problem that the flash memory has, a basic method of controlling an AND-type flash memory will be discussed with reference to FIGS. 2 and 3.

Figure 2:
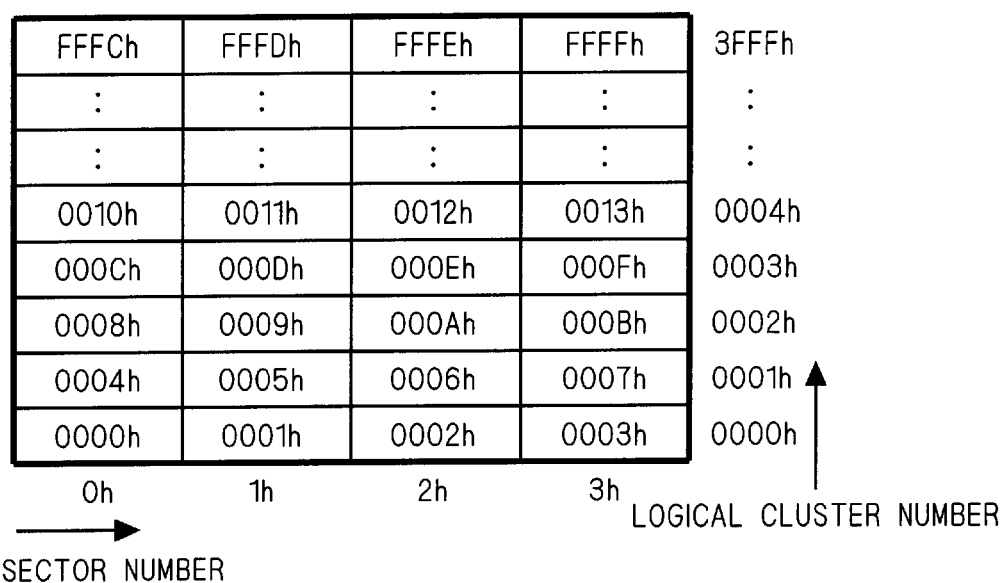
FIG. 2 shows a sector array of a single AND-type flash memory having a capacity of 256 megabits.

FIG. 2 is a conceptional diagram showing a sector array of one 256-Mbit memory in which a plurality of sectors each having 512 bytes are arrayed in four columns.

To each sector assigned is a logical sector number in hexadecimal notation with its starting point (0000h) at the sector on the leftmost lowest stage, increasing rightward to have a number of FFFFh on the rightmost highest stage.

In the 256-Mbit memory, four sectors each having 512 bytes arrayed horizontally constitute one flash sector. A single flash sector or a set of flash sectors is referred to as a cluster. In FIG. 1, one logical cluster consists of one flash sector and logical cluster numbers 0000h to 3FFFh are so assigned as to increase upward from the lowest. Further, sector numbers 0h to 3h are sequentially assigned from the leftmost hand.

When the AND-type flash memory is used for a card-type memory device such as an ATA card, since the operations of read, program (write) and erase are performed in units of 512 bytes, in a case of the 256-Mbit memory, data of 2048 bytes in one flash sector are divided by four and serially processed in units of 512 bytes by an operation of a controller. For example, in FIG. 2, when the flash sector with the logical cluster number 0000h is designated, a processing begins with the sector with the logical sector number 0000h and the processing goes on in the order of the logical sector numbers 0001h, 0002h and 0003h.

The above-discussed control method can be equally used also in a case of using a plurality of AND-type flash memories. FIG. 3 shows a configuration where four 256-Mbit memories are used.

Figure 3:
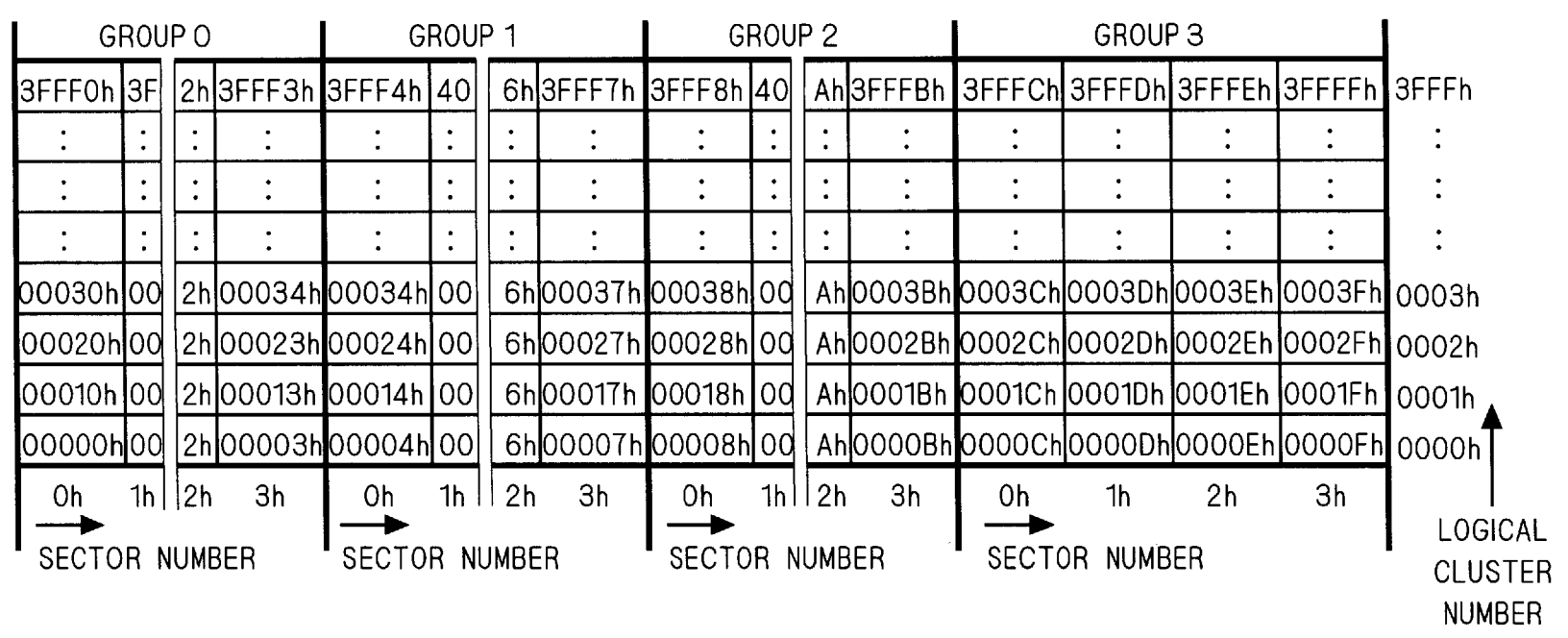

FIG. 3 shows a state where sectors in matrix array constituting four 256 M-bit memories which are represented as groups 0, 1, 2 and 3, respectively, are arrayed in parallel.

Each group has a configuration where a plurality of sectors each having 512 bytes are arrayed in four columns (partly omitted in FIG. 3), like the configuration shown in FIG. 2. The logical sector numbers are so assigned to the sectors as to increase rightward from left hand, being continuous numbers (0000h to 3FFFFh) through all the groups.

Further, in FIG. 3, four flash sectors constitute one logical cluster and the logical cluster numbers 0000h to 3FFFh are so sequentially assigned as to increase upward from the lowest. Furthermore, in each group, the sector numbers 0h to 3h are sequentially assigned from the leftmost hand.

Thus, since data are handled in a unit of flash sector in the flash memory, for example, combination of the 256-Mbit memory in which one flash sector consists of four sectors and the 64-Mbit memory in which one flash sector consists of one sector causes the following drawback.

Specifically, in a case where the controller for the 256-Mbit memory which is configured to continuously handle data on the four sectors controls the 64-Mbit memory, when data is read out from one sector and a control is shifted from the sector to the next one, since no next sector is found in the 64-Mbit memory, there sometimes arises an error to cause a system down.

The simplest way to solve this problem is to use a plurality of controllers to perform controls for memories of different capacities. An increase in the number of controllers, however, results in a complicated constitution of the card-type memory device and the possible number of memories to be provided is limited by the increase in the number of controllers, to cause another drawback that the storage capacity of the card-type memory device can not increase.

The present inventor has invented a method of managing sectors in which a plurality of memories having different capacities can be controlled by one controller. Hereafter, this method will be discussed in the preferred embodiments.

A. The First Preferred Embodiment

In the first preferred embodiment, discussion will be made on a case where a 256-Mbit memory and a 64-Mbit memory are mounted on a card-type memory device.

<A-1. Sector Array>

Figure 4:
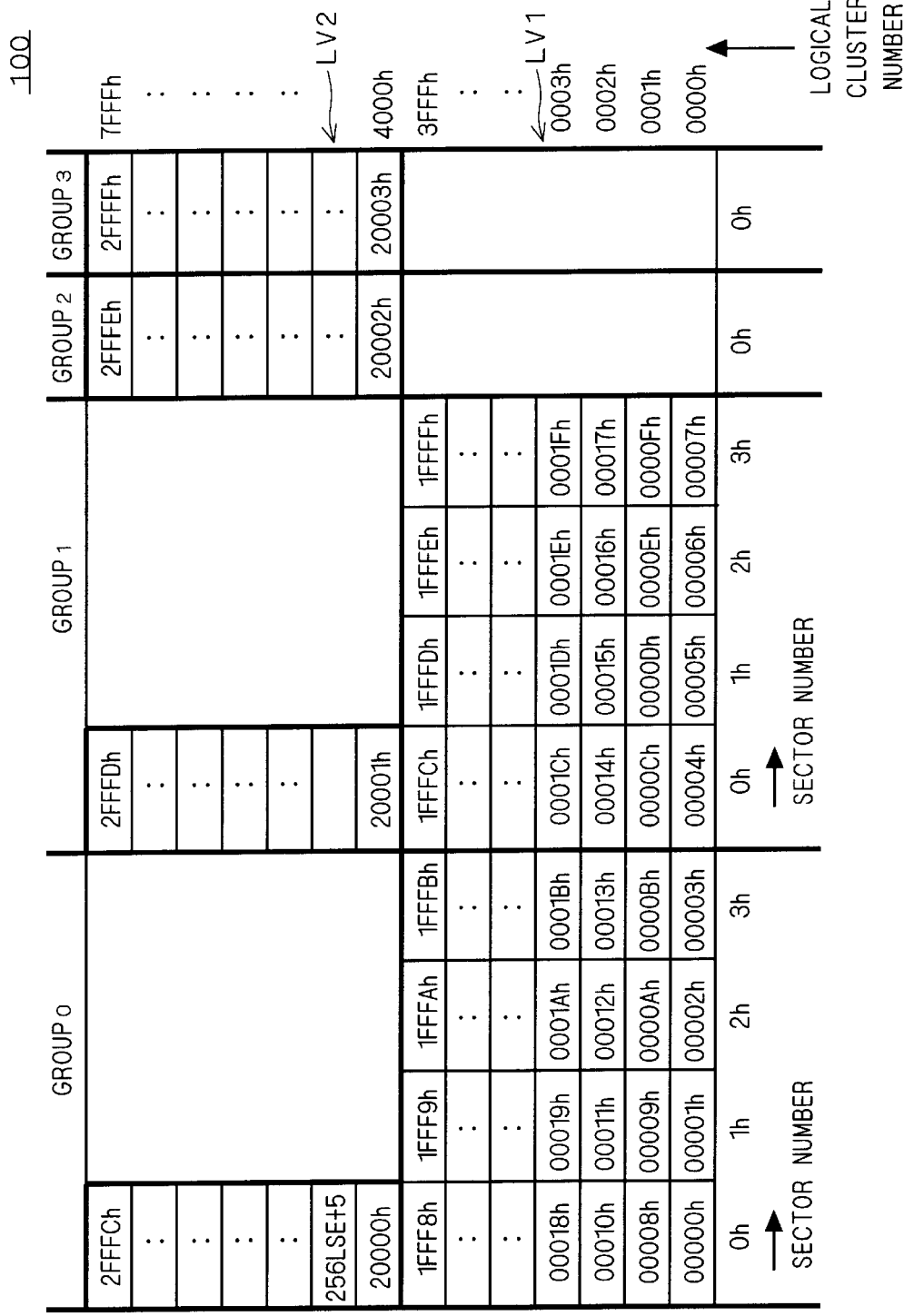
FIG. 4 shows a sector array of an AND-type flash memory in accordance with a first preferred embodiment of the present invention.

FIG. 4 is a conceptional diagram showing a sector array of a flash memory 100 in accordance with the first preferred embodiment of the present invention. FIG. 4 shows a sector array in which two 256-Mbit memories allocated to a first level LV1 and four 64-Mbit memories are allocated to a second level LV2.

Each of the two 256-Mbit memories has a configuration where a plurality of sectors each having 512 bytes are arrayed in four columns. The two 256-Mbit memories are allocated to groups 0 and 1, respectively, and the sector numbers 0h to 3h are sequentially assigned from the leftmost hand in each group.

In each of the groups 0 and 1 found is the second level LV2 other than the first level LV1, to which one 64-Mbit memory is allocated. The 64-Mbit memory has a configuration where a plurality of sectors each having 512 bytes are arrayed in one column.

In FIG. 4, the sector array of the 64-Mbit memory belongs to the sector number 0h and no sector exists in each of the sector numbers 1h, 2h and 3h, but allocation of the sector array in the 64-Mbit memory is not limited to this case.

Other two 64-Mbit memories are allocated to the groups 2 and 3, each of which has a configuration where a plurality of sectors each having 512 bytes are arrayed in one column in the second level LV2. Further, to each sector array, the sector number 0h is assigned. In each of the groups 2 and 3 of the first level LV1, no 256-Mbit memory exists.

A logical sector number in hexadecimal notation is assigned to each sector, with its starting point (00000h) at the sector on the leftmost lowest stage of the 256-Mbit memory, increasing rightward to have a number of 1FFFFh on the rightmost highest stage of the 256-Mbit memory.

With respect to the 64-Mbit memories, a logical sector number 20000h is assigned to the lowest sector in the sector array included in the group 0 and further logical sector numbers are assigned to the sector arrays included in the groups 1 to 3, increasing rightward to have a number of 2FFFFh on the highest stage in the sector array included in the group 3. Thus, the logical sector numbers are so assigned as to form continuous numbers through all the sectors in the 256-Mbit memories and the 64-Mbit memories.

Further, in FIG. 4, two flash sectors constitute one logical cluster in the 256-Mbit memory, and the logical cluster numbers 0000h to 3FFFh are so sequentially assigned as to increase upward from the lowest. On the other hand, in the 64-Mbit memory, four flash sectors constitute one logical cluster and the logical cluster numbers 4000h to 7FFFh are so sequentially assigned as to increase upward from the lowest.

<A-2. Control Operation>

First, referring to FIG. 5, a general constitution of the card-type memory device will be discussed, and then a control operation of the flash memory 100 will be discussed.

Figure 5:
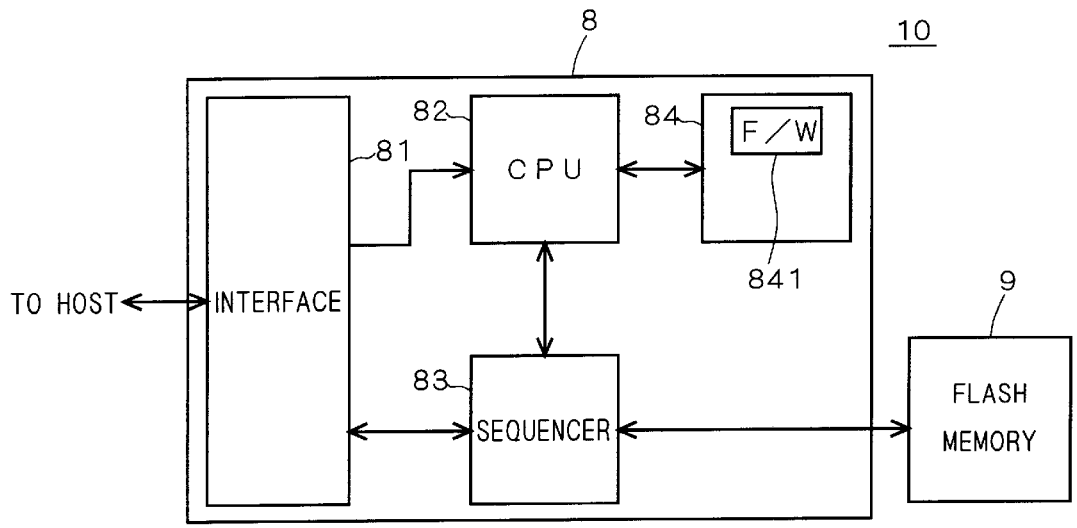
FIG. 5 shows a general constitution of a card-type memory device.

In FIG. 5, a card-type memory device 10 mainly comprises a flash memory 9 and a controller 8 for controlling and managing the flash memory 9. The controller 8 mainly comprises an interface 81 for making a connection with a host system such as a personal computer, a CPU (Central Processing Unit) 82, a sequencer 83 for controlling an operation of the flash memory 9 and a memory 84 having a firmware storage memory 841 for storing programs as firmware.

The firmware is a software for making a table used for managing (converting) the logical address given from the host system and the physical address in the flash memory 9 and making a user area (accessible by the host), and selects a physical address avoiding a defective sector to ensure a predetermined memory capacity and associates the physical address with the logical address to make the sector array to which the continuous logical sector numbers are assigned as shown in FIG. 4. Further, the last logical sector number of the 256-Mbit memory and the last logical cluster number 7FFFh are stored in the memory 84 so as to be referred to through the CPU 82, as required. Furthermore, it goes without saying that the sector array of FIG. 4 is formed in the user area.

The association between the logical address and the physical address is made in a unit of cluster. This association is achieved by storing the physical cluster number corresponding to the logical cluster and referring to a cluster management table to be stored in the flash memory 9.

Since this cluster management table, storing the physical addresses corresponding to all the logical addresses, needs a vast number of sectors, a map which is referred to as a table map indicating where and how the cluster management table is stored in the flash memory 9 is also stored in the flash memory 9.

Since the table map also needs a number of sectors, a table which is referred to as a pointer table indicating where and how the table map is stored in the flash memory 9 is also stored in the flash memory 9.

Next, referring to the flow chart of FIG. 6, a control operation of the flash memory 100 will be discussed. In the following discussion, the card-type memory device of FIG. 5 is referred to, but it goes without saying that the flash memory 100 of FIG. 4 is referred to, instead of the flash memory 9.

Figure 6:
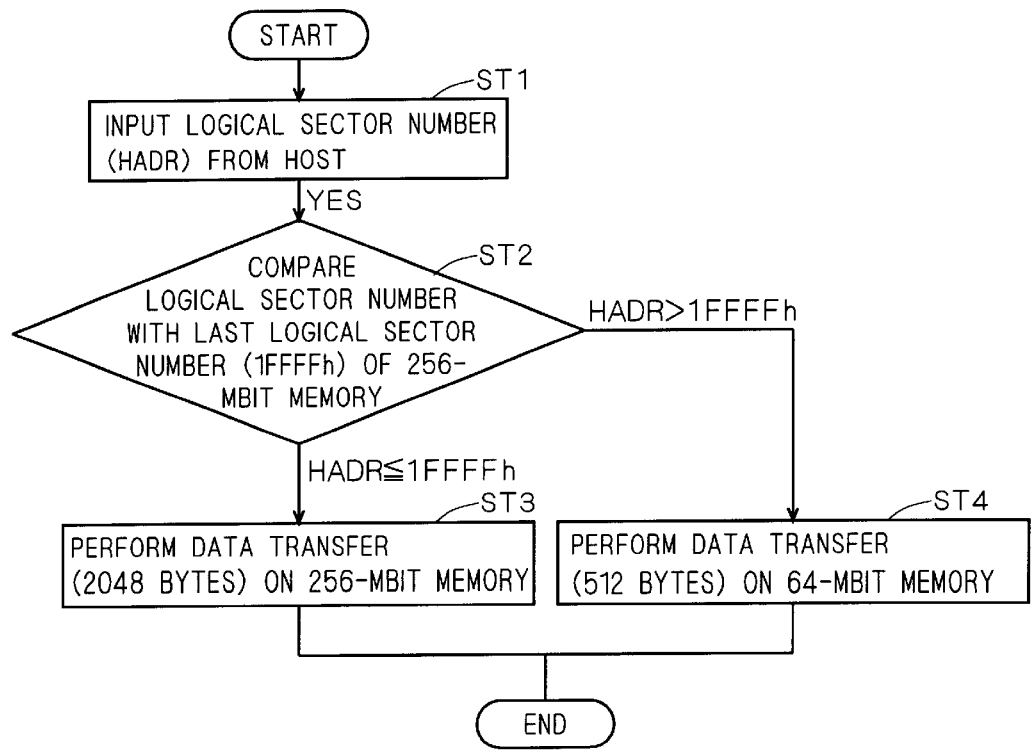
FIG. 6 is a flow chart showing a method of controlling the AND-type flash memory in accordance with the first preferred embodiment of the present invention.

When the logical sector number (sometimes abbreviated to HADR) of the sector requiring data transfer (any one of read, program (write) and erase) is inputted from the host system to the card-type memory device 10 as shown in step ST1 of FIG. 6, the CPU 82 compares the logical sector number with the last logical sector number (1FFFFh) of the 256-Mbit memory (step ST2). As a result, when the HADR is not higher than 1FFFFh, a data transfer (transferring data of 2048 bytes in units of four sectors) is performed on the sector designated by the host system (in this case, the sector of the 256-Mbit memory in the first level LV1) in step ST3.

On the other hand, when it is judged that the HADR is higher than 1FFFFh in the step ST2, a data transfer (transferring data of 512 bytes in a unit of one sector) is performed on the sector designated by the host system (in this case, the sector of the 64-Mbit memory in the second level LV2) in step ST4.

The sequencer 83 is configured so that, for example, when the logical sector number 20000h which belongs to the group 0 is designated by the host system, after the data transfer of 512 bytes, no further data transfer may be performed.

When the steps ST3 and ST4 are finished, a series of operations are completed and next input of the logical sector number from the host system is waited.

As discussed earlier, the association between the logical address and the physical address is made in a unit of cluster, and the CPU 82 calculates the logical cluster number from the inputted logical sector number, to obtain the logical address.

Specifically, since the logical sector numbers are sequentially assigned from 00000h, in a case of simplest sector array as shown in FIG. 4, by dividing the logical sector number by the number of sectors in one cluster, the logical cluster number can be obtained from a value of the quotient.

For example, when the logical sector number is 00008h, division of this number 00008h by the number of sectors in one cluster, i.e., 8 gives a quotient of 1 and thereby the logical cluster number of 00001h is obtained.

The group to which the given logical sector number belongs can be obtained from a value of quotient given by dividing the logical sector number by the sum of the number of groups and the product of the number of sectors in one cluster and the logical cluster number.

For example, when the logical sector number is 00008h, as the product of the number of sectors in one cluster and the logical cluster number is 8 and the number of groups is 4, the sum of these numbers is 12. Division of the logical sector number 00008h by 12 gives a quotient of 0 and the group number of 0 is obtained.

Though the method of obtaining the logical cluster number and the like has been discussed above taking the case of 256-Mbit memory as an example, the same applies to the 64-Mbit memory. In the case of 64 M-bit memory, however, it is necessary to consider the last sector number of the 256-Mbit memory and the number of sectors in one cluster which is different from the case of the 256-Mbit memory.

Specifically, the value obtained by subtracting the last sector number of the 256-Mbit memory from the given logical sector number is divided by the number of sectors in one cluster, i.e., 4 and a value of the quotient and a value obtained by adding 1 to the last logical cluster number of the 256-Mbit memory are added. Thus, the logical cluster number of the 64-Mbit memory can be obtained.

For example, in the case of obtaining the logical cluster number of the sector with the logical sector number 20000h, the last logical sector number of the 256-Mbit memory is 1FFFFh, and subtraction of 1FFFFh from 20000h gives a difference of 1. Division of the value of 1 by the number of sectors in one cluster, i.e., 4 gives a quotient of 0. Since the last logical cluster number 3FFFh, the sum obtained by adding the last logical cluster number 3FFFh and the value of 1, i.e., 4000h is the logical cluster number to be obtained.

ps <A-3. Function and Effect>

Thus, also as to a plurality of flash memories having different capacities, the firmware is configured so that the sectors may be arrayed with only the memories of the same capacity allocated to one level and continuous logical sector numbers may be assigned to all the sectors. Further, the sequencer is configured so that the level to which the sector designated on the basis of comparison result between the last logical sector number of each level and the externally-given logical sector number is allocated may be detected and a transfer operation according to the type of memory included in the level can be performed. With these configurations, it becomes possible to control a plurality of memories having different capacities with one controller.

Though commands given to the CPU and the sequencer are slightly different in some times when the memories have different capacities, to solve this problem, the CPU and the sequencer has only to be so configured as to support the commands for all the flash memories in practical use.

Further, a plurality of flash memories are divided into a plurality of groups and this allows a parallel operation where a flash memory in one group performs a transfer operation while a flash memory in another group prepares a transfer operation, thereby enhancing efficiency in the transfer operations.

Furthermore, since the first and second levels each include a plurality of logical clusters constituted of a plurality of arrayed logical sectors bridging a plurality of groups and continuous logical cluster numbers are assigned to all the logical clusters, the same logical cluster number is not found in both the first and second levels and therefore it becomes easier to control the sector addresses.

B. The Second Preferred Embodiment

In the first preferred embodiment, discussion has been made as above on the control method in the case where the 256-Mbit and 64-Mbit AND-type flash memories are mounted on one card-type memory device. In the second preferred embodiment, discussion will be made on a control method in a case where an AND-type flash memory of 512 megabits (referred to as 512-Mbit memory) to be used in the future and the 256-Mbit memory are mounted on one card-type memory device.

The AND-type flash memory has eight input/output terminals and allows 16-bit data input/output by division transfer of the high-order-8-bit data and the low-order-8-bit data. Since the flash memory having a capacity not larger than 256 megabits, however, receives signals of 14 bits by dividing the signals into signals IO0 to IO7 (generally referred to as sector address SA1) representing the low-order 8 bits and signals I08 to IO13 (generally referred to as sector address SA2) representing the high-order 6 bits, signals IO14 and IO15 which can be inputted from the remainder one input/output terminal are not used.

The present inventor notes that use of at least one of the signals IO14 and IO15 extends the total number of accessible sector addresses and even the 512-Mbit memory has only to have eight input/output terminals, which leads to the present invention relating to the control method in the case where the 512-Mbit memory and the 256-Mbit memory are mounted on one card-type memory device.

<B-1. Concept of Control Method>

FIG. 7 is a conceptional diagram showing a method of controlling the 512-Mbit memory. FIG. 7 illustrates a configuration where a 512-Mbit memory 90 is divided into two levels as 256-Mbit memories 91 and 92 so that a 256-Mbit memory is may be included in each of the first and second levels LV1 and LV2. Further, in this configuration, an IO bus 13 is connected between the controller 8 and the 512-Mbit memory 90 and chip enable signals 11 and 12 are transferred therebetween.

The 512-Mbit memory 90 has sectors twice in number as many as the 256-Mbit memory and the logical cluster numbers ranging 0000h to 7FFFh. In the control method of the second preferred embodiment, however, the 512-Mbit memory is divided into the 256-Mbit memories 91 and 92 (the first and second virtual memory devices), each virtually having the logical cluster numbers 0000h to 3FFFh, as shown in FIG. 7. In this method, a control is made so that one of the 256-Mbit memories 91 and 92 may be selected on the basis of the chip enable signal 11 given from the controller 8 and the total number of sector addresses may be extended by the signal IO14 inputted through an unused input/output pin (supplied through a wiring included in the IO bus 13).

<B-2. Control Operation>

Next, referring to the flow chart of FIG. 8, a control operation of the 512-Mbit memory 90 will be discussed. In the following discussion, the card-type memory device of FIG. 5 is referred to, but it goes without saying that the 512-Mbit memory 90 of FIG. 7 is referred to, instead of the flash memory 9.

Figure 8:
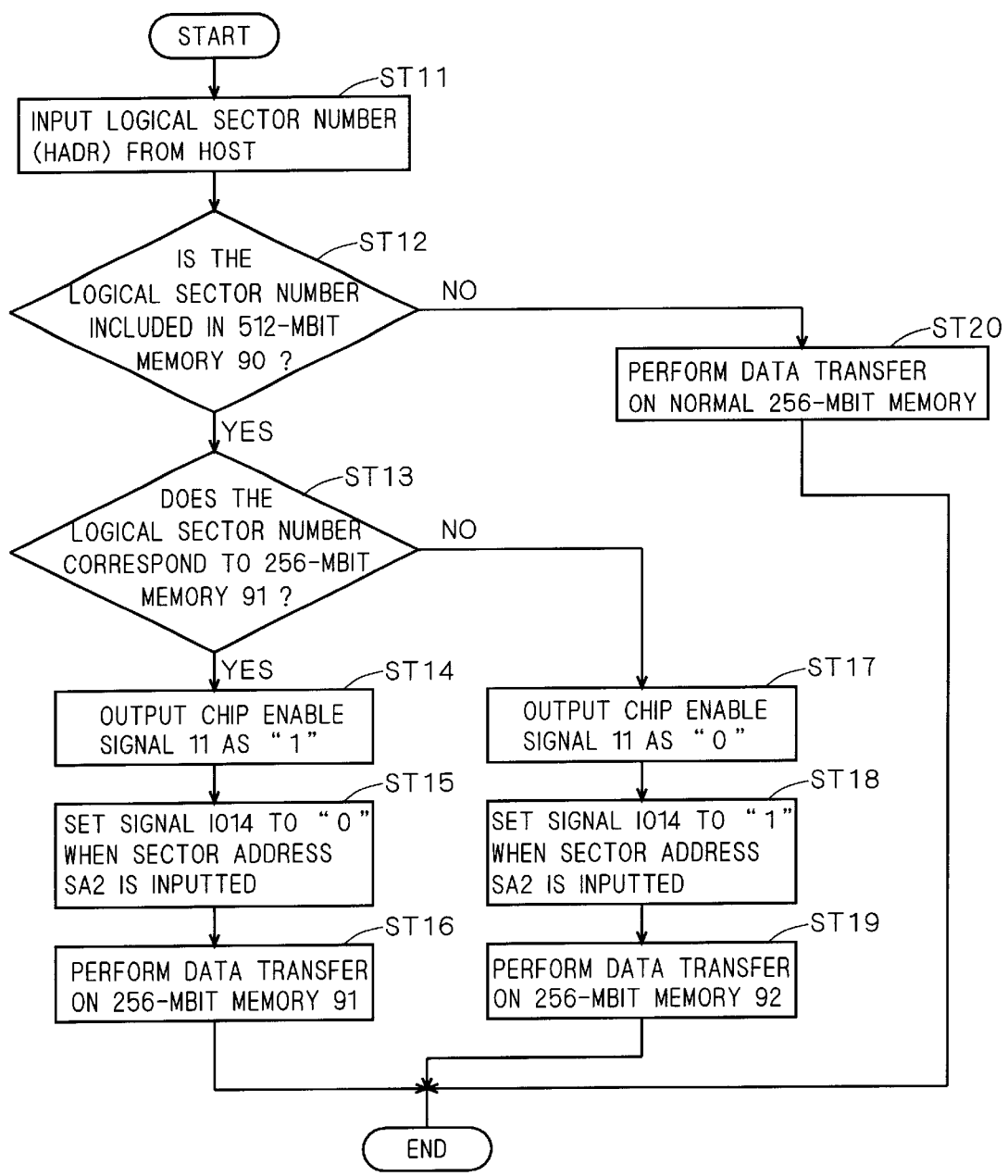
FIG. 8 is a flow chart showing a method of controlling the AND-type flash memory in accordance with the second preferred embodiment of the present invention.

When the logical sector number (sometimes abbreviated to HADR) of the sector requiring data transfer (any one of read, program (write) and erase) is inputted from the host system to the card-type memory device 10 as shown in step ST11 of FIG. 8 and the CPU 82 judges that the given logical sector number is one included in the 512-Mbit memory 90 (step ST12), the CPU 82 outputs the chip enable signal 12 as "0" and judges whether the logical sector number is included in the 256-Mbit memory 91 or 92 (step ST13).

Then, when the above logical sector number is included in the 256-Mbit memory 91, the CPU 82 outputs the chip enable signal as "1"(step ST14), and applies the signal IO14 as "0" to the unused input/output pin when the signals IO8 to IO13 of the sector address SA2 are inputted, following the input of the sector address SA1 (the signals IO0 to IO7). The 512-Mbit memory 90, receiving the signal, judges that the 256-Mbit memory 91 is selected and performs a predetermined transfer operation on the basis of the given logical sector number.

On the other hand, when the logical sector number inputted from the host system is one included in the 256-Mbit memory 92, the CPU 82 outputs the chip enable signal 11 as "0" (step ST17) and applies the signal IO14 as "1" to the unused input/output pin when the signals IO8 to IO13 of the sector address SA2 are inputted, following the input of the sector address SA1 (the signals IO0 to IO7), to virtually output an address signal of 15 bits. The 512-mbit memory 90, receiving the address signal, judges that the 256-Mbit memory 92 is selected and performs a predetermined transfer operation on the basis of the given logical sector number, to access the sector included in the logical sector numbers 4000h to 7FFFh of the 512-Mbit memory 90 (step ST19).

As the signal IO14 (instead, the signal IO15 may be used) is given as "1" to extend the total number of sector addresses when the logical sector number inputted from the host system is one included in the 256-Mbit memory 92, the signal IO14 can be referred to as an extension signal.

Further, in the step ST12, when it is judged that the logical sector number inputted from the host system is one included in a 256-Mbit memory other than the 512-Mbit memory 90 (that is, a normal 256-Mbit memory), the CPU 82 outputs the chip enable signal 12 as "1" and performs a transfer operation on the normal 256-Mbit memory (step ST20).

Furthermore, when any one of the steps ST16, ST19 and ST20 is finished, a series of operations are completed and next input of the logical sector number from the host system is waited.

Figure 9:
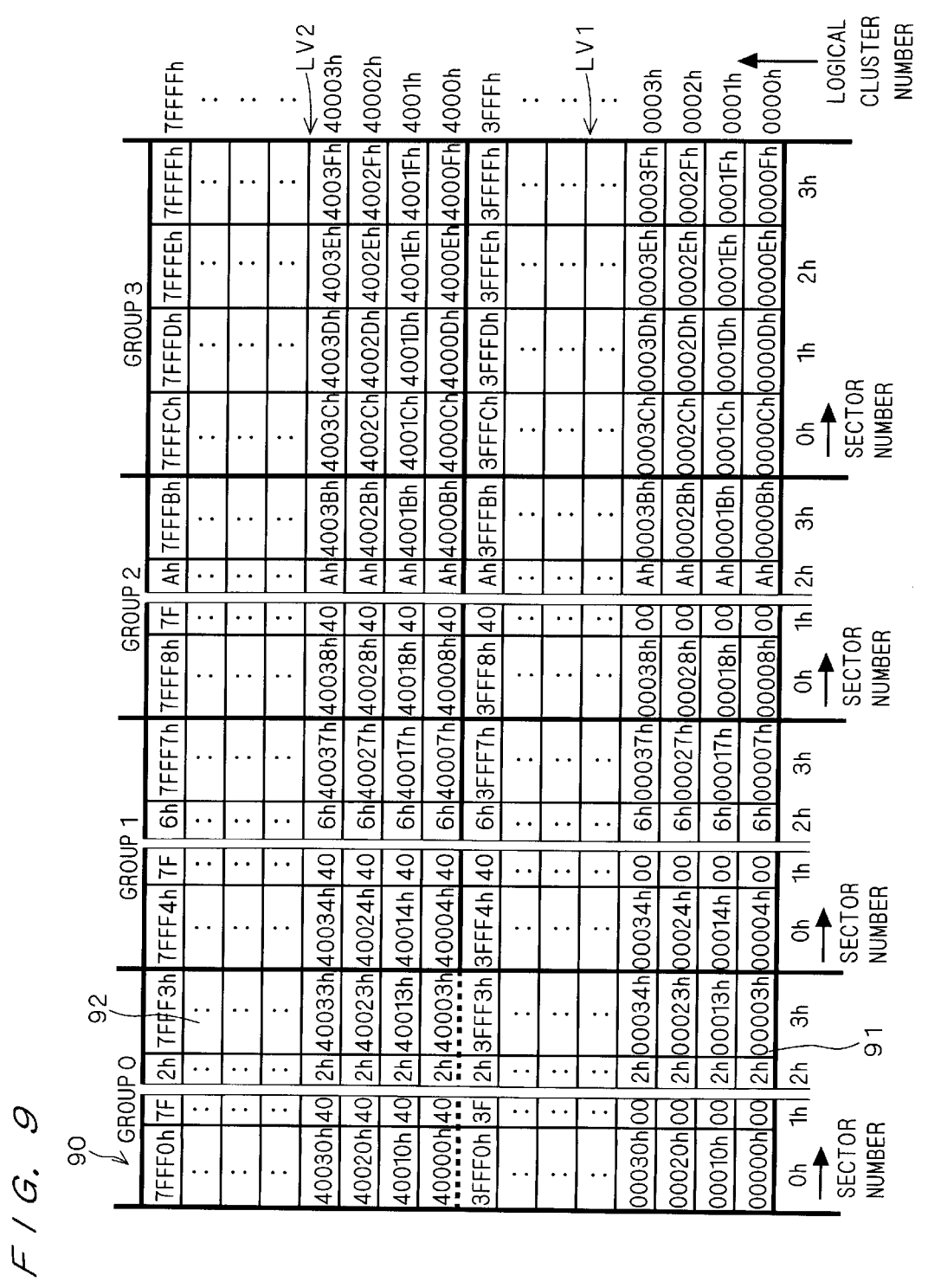

FIG. 9 shows a sector array in a case where six 256-Mbit memories and one 512-Mbit memory are mounted.

In FIG. 9, sectors are arrayed so that the 512-Mbit memory 90 may be virtually divided into the first and second levels LV1 and LV2 as the 256-mbit memories 91 and 92, and the 256-Mbit memories 91 and 92 may constitute the group 0.

As to the six 256 M-bit memories, the 256-Mbit memory 91 and continuously following three 256-Mbit memories constitute the first level LV1 and the 256-Mbit memory 92 and continuously following three 256-Mbit memories constitute the second level LV2.

Then, sets of vertically-arrayed 256-Mbit memories constitute the groups 1, 2 and 3.

Each 256-Mbit memory has a configuration where a plurality of sectors each having 512 bytes are arrayed in four columns, like the configuration of FIG. 2, and the logical sector numbers are so assigned to the sectors as to increase rightward from the left hand. The logical sector numbers are so assigned as to be continuous through all the groups, ranging from 0000h to 7FFFFFh.

Further, in FIG. 9, four flash sectors constitute one logical cluster and the logical cluster numbers 0000h to 7FFFh are so assigned as to sequentially increase upward from the lowest. In each group, the sector numbers 0h to 3h are sequentially assigned from the leftmost.

Furthermore, the sector array of the 512-Mbit memory does not bridge different groups so as to allow a parallel operation. Specifically, assuming that there are adjacent first and second flash memories, when the first flash memory performs a transfer operation, the flash memory outputs a "busy" signal to the controller 8 while the second flash memory for the nest transfer operation prepares the transfer. When the transfer operation is completed, the first flash memory outputs a "ready" signal while the second flash memory starts the transfer operation, outputting the "busy" signal. This is the parallel operation of the flash memories. Usually, the "ready" signal and the "busy" signal are given through the same signal line to one flash memory.

Accordingly, in a case where the 512-Mbit memory is divided into two 256-Mbit memories and these memories are included in adjacent different groups, since one 256-Mbit memory outputs the "ready" signal when its transfer operation is finished, the other 256-Mbit memory can perform no transfer operation until the "ready" signal is stopped and the parallel operation is delayed. To prevent this state, the sector array is configured so that the 512-Mbit memory may be included in different levels of one group.

<B-3. Function and Effect>

Thus, by performing a control so that the 512-Mbit memory may be divided into the 256-Mbit memories 91 and 92, being arrayed separately in vertical two levels, one of the 256-Mbit memories may be selected on the basis of the chip enable signal 11 given from the controller 8 and the total number of sector addresses may be extended with the signal IO14 inputted through the unused input/output pin, substantially the same configuration as a configuration where eight 256-Mbit memories are arrayed separately in two levels is obtained and thereby the logical cluster numbers and the logical sector numbers can be assigned in the same manner as conventionally. As a result, it becomes possible to control the memories having different capacities with one controller.

While the invention has been shown and described in detail, the foregoing description is in all aspects illustrative and not restrictive. It is therefore understood that numerous modifications and variations can be devised without departing from the scope of the invention.

What is claimed is:

1. A method of controlling a semiconductor memory device, for controlling operations of at least one first memory element and at least one second memory element which are different from each other, wherein
    said at least one first memory element and said at least one second memory element each has a memory area consisting of a plurality of sectors,
    a first access operation is performed on said at least one first memory element when a memory area to be externally accessed belongs to said at least one first memory element, and
    a second access operation is performed on said at least one second memory element when said memory area to be externally accessed belongs to said at least one second memory element,
said method further comprising, prior to said first and second access operations, the steps of:
    (a) assigning logical sector numbers each not larger than a predetermined value to said plurality of sectors in said at least one first memory element and assigning logical sector numbers each larger than said predetermined value to said plurality of sectors in said at least one second memory element; and
    (b) designating said memory area to be externally accessed by said logical sector number and comparing a designated-sector number which is thus designated with said predetermined value.

2. The method according to claim 1, wherein
said logical sector numbers assigned to said sectors in said at least one first memory element are arrayed in units of first predetermined number and said logical sector numbers assigned to said sectors of said at least one second element are arrayed in units of second predetermined number in said step (a), and
said method further comprising the step of:
    (c) performing said first access operation and said second access operation in units of said first predetermined number and in units of said second predetermined number, respectively.

3. The method according to claim 2, wherein
said at least one first memory element provides a plurality of first memory elements and said at least one second memory element provides a plurality of second memory elements, and
a logical cluster number is assigned to common to said plurality of first memory elements in units of said first predetermined number and another logical cluster number is assigned in common to said plurality of second memory elements in units of said second predetermined number in said step (a).

4. A method of controlling operations of a semiconductor memory device, said semiconductor memory device comprising: at least one first memory having a first storage capacity and at least one second memory having a second storage capacity twice as large as said first storage capacity, said at least one second memory being formed on a chip different from a chip on which said at least one first memory is formed, said method comprising the steps of:
    (a) separately recognizing said at least one second memory as a first virtual memory element and a second virtual memory element each having said first storage capacity, based on a chip enable signal input to said second memory; and
    (b) performing the same access operation as performed on said at least one first memory on each of said first and second virtual memory elements.

5. The method according to claim 4, including the step of:
generating an extension signal indicating whether said first virtual memory element or said second virtual memory element a memory area to be externally accessed belongs to, together with a designated-address signal specifying said memory area to be externally accessed.

6. The method according to claim 5, wherein
said at least one first memory and said at least one second memory each has a memory area consisting of a plurality of sectors,
logical sector numbers are assigned to all said plurality of sectors, said logical sector numbers being different from one another, said logical sector numbers are arrayed in units of predetermined number in each of said at least one first memory and said at least one second memory element, and said step (b) includes a step of accessing said memory area to be externally accessed in units of said predetermined number.

7. The method according to claim 6, wherein said at least one first memory and said at least one second memory each has a predetermined number of input terminals for inputting said designated-address signal, and said extension signal is inputted to said at least one second memory through a terminal among said plurality of input terminals of said at least one second memory, said terminal corresponding to a redundant terminal of said input terminals of said at least one first memory.

* * * * *